(12) United States Patent
Kokubun

(10) Patent No.: US 7,417,285 B2
(45) Date of Patent: *Aug. 26, 2008

(54) SEMICONDUCTOR DEVICE HAVING A TRENCH CAPACITOR AND A MOSFET CONNECTED BY A DIFFUSION LAYER AND MANUFACTURING METHOD THEREOF

(75) Inventor: Koichi Kokubun, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 101 days.

This patent is subject to a terminal disclaimer.

(21) Appl. No.: 11/034,939

(22) Filed: Jan. 14, 2005

(65) Prior Publication Data

US 2005/0179074 A1 Aug. 18, 2005

Related U.S. Application Data

(63) Continuation-in-part of application No. 10/443,782, filed on May 23, 2003, now Pat. No. 6,849,890.

(30) Foreign Application Priority Data

Jul. 15, 2002 (JP) ............................. 2002-206174
Oct. 7, 2004 (JP) ............................. 2004-294914

(51) Int. Cl.
  *H01L 29/76* (2006.01)
(52) U.S. Cl. ..................... 257/345; 257/301; 257/341; 257/365; 257/E27.084
(58) Field of Classification Search ................ 257/301, 257/302; 438/242, 243
See application file for complete search history.

(56) References Cited

U.S. PATENT DOCUMENTS

| | | | |
|---|---|---|---|
| 5,923,987 A * | 7/1999 | Burr | 438/304 |
| 6,093,951 A * | 7/2000 | Burr | 257/408 |
| 6,238,967 B1 | 5/2001 | Shiho et al. | |
| 6,274,441 B1 * | 8/2001 | Mandelman et al. | 438/286 |
| 6,329,235 B1 | 12/2001 | Kuo | |
| 6,355,954 B1 | 3/2002 | Gall et al. | |
| 6,444,548 B2 | 9/2002 | Divakaruni et al. | |
| 2003/0124788 A1 * | 7/2003 | Roberts | 438/200 |

(Continued)

FOREIGN PATENT DOCUMENTS

JP  8-17938  1/1996

(Continued)

*Primary Examiner*—Wai-Sing Louie
(74) *Attorney, Agent, or Firm*—Oblon, Spivak, McClelland, Maier & Neustadt, P.C.

(57) ABSTRACT

A semiconductor device comprises a semiconductor substrate having a first conductivity type, a trench capacitor, provided in the semiconductor substrate, having a charge storage region, a gate electrode provided on the semiconductor substrate via a gate insulating film, first and second impurity regions, provided at both ends of the gate electrode, respectively, having a second conductivity type, an isolation insulating film provided adjacent to the trench capacitor in the semiconductor substrate to cover an upper surface of the charge storage region, a buried strap region having the second conductivity type, the buried strap region being provided to electrically connect an upper portion of the charge storage region to the first impurity region in the semiconductor substrate, and a pocket implantation region having the first conductivity type, the pocket implantation region being provided only under the second impurity region and being spaced apart from the strap region.

4 Claims, 5 Drawing Sheets

U.S. PATENT DOCUMENTS

2003/0153138 A1 * 8/2003 Tran .......................... 438/197
2004/0188832 A1 * 9/2004 Nguyen ..................... 257/723

FOREIGN PATENT DOCUMENTS

| | | |
|---|---|---|
| JP | 9-232444 | 9/1997 |
| JP | 10-294443 | 11/1998 |
| JP | 2000-252445 | 9/2000 |
| JP | 2000-357779 | 12/2000 |
| JP | 2002-83941 | 3/2002 |

* cited by examiner

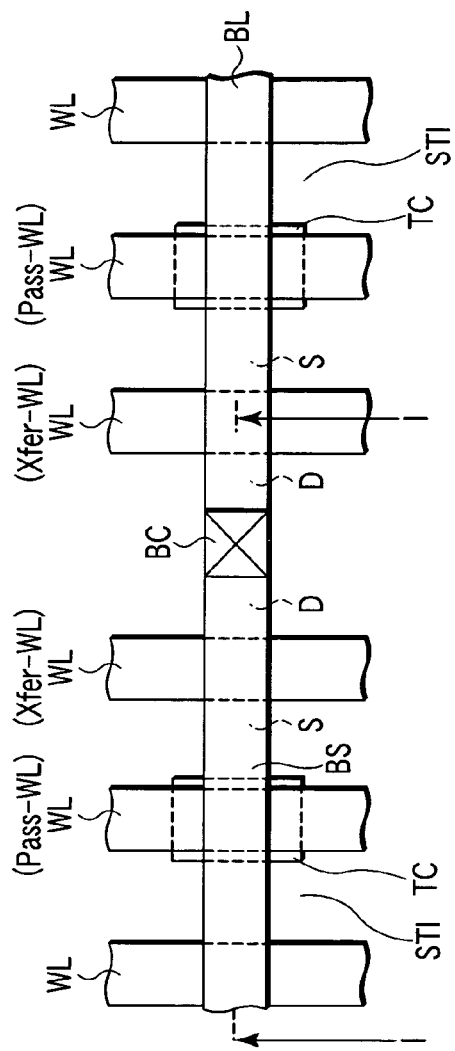
F I G. 2
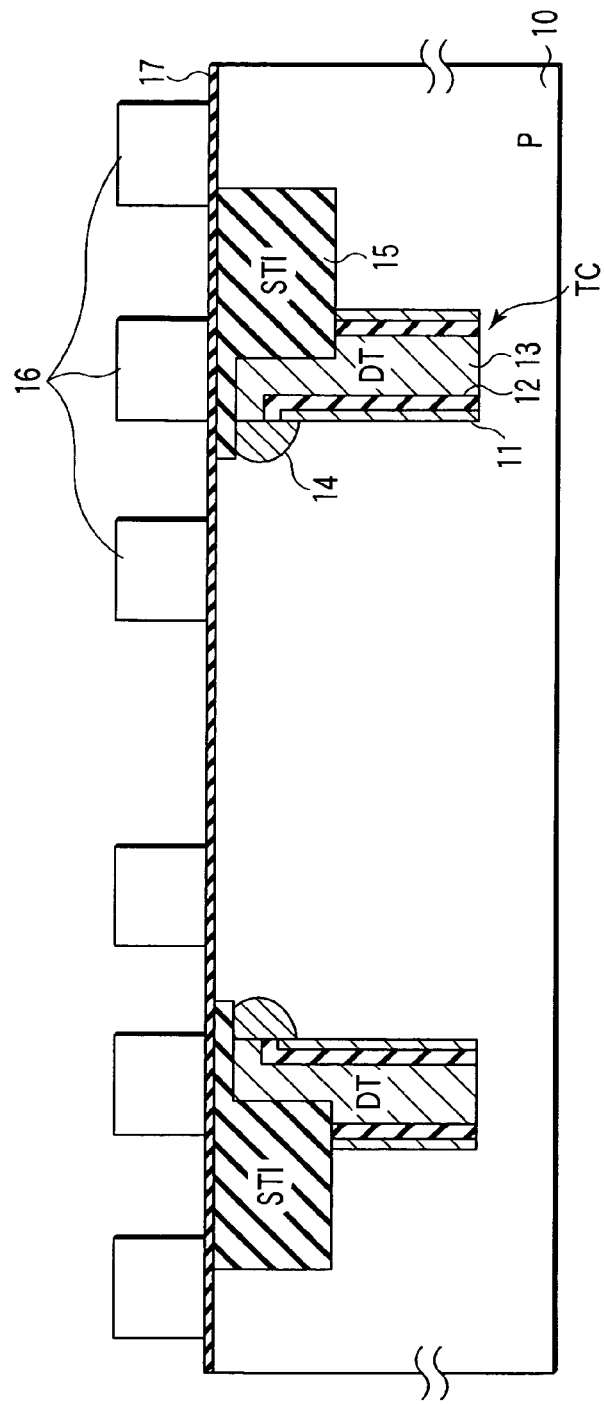
F I G. 3

SEMICONDUCTOR DEVICE HAVING A TRENCH CAPACITOR AND A MOSFET CONNECTED BY A DIFFUSION LAYER AND MANUFACTURING METHOD THEREOF

CROSS-REFERENCE TO RELATED APPLICATIONS

This is a Continuation-in-Part application of U.S. patent application Ser. No. 10/443,782, filed May 23, 2003, now U.S. Pat. No. 6,849,890 the entire contents of which are incorporated herein by reference.

This application is based upon and claims the benefit of priority from prior Japanese Patent Applications No. 2002-206174, filed Jul. 15, 2002; and No. 2004-294914, filed Oct. 7, 2004, the entire contents of both of which are incorporated herein by reference.

BACKGROUND OF THE INVENTION

1. Field of the Invention

The present invention relates to a semiconductor device and a method of manufacturing the same and, more particularly, to a memory device structure in which a trench capacitor and a MOSFET are connected via a diffusion layer and a manufacturing method thereof. The present invention will be applied to, e.g., a dynamic semiconductor memory (DRAM) and a DRAM/logic-embedded device.

2. Description of the Related Art

With recent development of information communication, the high operating speed and the high integration density of various devices have been required in the semiconductor device technical field. Of such devices, a DRAM/logic-embedded device in which a DRAM and logic circuit are integrated into one chip can realize a large-capacity memory and high data transfer speed, and is growing in demand. A recent DRAM/logic-embedded device structure includes a DRAM array region where a buried strap type trench cell is formed, and a logic region where a MOSFET having a salicide structure in gate/source/drain regions is formed.

As described above, the logic region adopts a salicide structure in which a metal silicide layer is formed on the upper surface of a MOSFET gate electrode/drain region/source region. High performance is realized using a thin film for a MOSFET gate oxide film.

To realize a high integration density and high speed also in the DRAM array region, the MOS polysilicon gate of a cell must be shrunk as much as possible, reducing the cell size. Simple shrinkage degrades the cell performance due to the short channel effect.

As a technique of suppressing the short channel described previously, there has been proposed a technique of pocket-implanting impurity which is the same type as that of the semiconductor substrate under a source/drain. However, as in a prior art, when pocket implantation is simply carried out under the source/drain of the cell transistor, a boron concentration of a BS junction becomes high to increase the junction leak. As a result, such an increased junction leak will deteriorate a charge retention characteristic of DRAM.

BRIEF SUMMARY OF THE INVENTION

According to a first aspect of the present invention, a semiconductor device comprises a semi-conductor substrate having a first conductivity type; a trench capacitor, provided in the semiconductor substrate, having a charge storage region; a gate electrode provided on the semiconductor substrate via a gate insulating film; a gate side wall insulating film provided on a side surface of the gate electrode; first and second impurity regions, provided at both ends of the gate electrode, respectively, having a second conductivity type; an isolation insulating film provided adjacent to the trench capacitor in the semiconductor substrate to cover an upper surface of the charge storage region; a buried strap region having the second conductivity type, the buried strap region being provided to electrically connect an upper portion of the charge storage region to the first impurity region in the semiconductor substrate; and a pocket implantation region having the first conductivity type, the pocket implantation region being provided only under the second impurity region and being spaced apart from the strap region.

According to a second aspect of the present invention, a method of manufacturing a semiconductor device comprises: sequentially forming a trench capacitor, an isolation region, a buried strap region having a second conductivity type, and a gate insulating film in a semiconductor substrate having a first conductivity type; depositing a polysilicon film on the gate insulating film to form a plurality of polysilicon gates; ion-implanting an impurity of the first conductivity type into the semiconductor substrate sequentially from at least two directions having an angle of more than 0° with respect to a direction perpendicular to the semiconductor substrate by using the plurality of polysilicon gates as a mask to provide a pocket implantation region, the pocket implantation region being not formed at one end of each of polysilicon gates and being formed at the other end thereof; forming a side wall film on each of the polysilicon gates; forming a first impurity region at the one end of each of the polysilicon gates and forming a second impurity region at the other end thereof; and forming a bit line to connect it to the second impurity region.

BRIEF DESCRIPTION OF THE SEVERAL VIEWS OF THE DRAWING

FIG. 2 is a plan view schematically showing the layout of a trench cell region, a word line WL, and a bit line BL in a DRAM array region of FIG. 1;

FIG. 3 is a sectional view schematically showing a part of DRAM array region formation steps;

DETAILED DESCRIPTION OF THE INVENTION

A first embodiment according to the present invention will be described in detail below with reference to the accompanying drawings. A DRAM/logic-embedded device according to the first embodiment adopts a pocket implantation technique generally known in the logic device field. This technique is applied to a MOSFET of a trench cell in a DRAM array region having a buried strap type trench cell structure.

Figure 1:
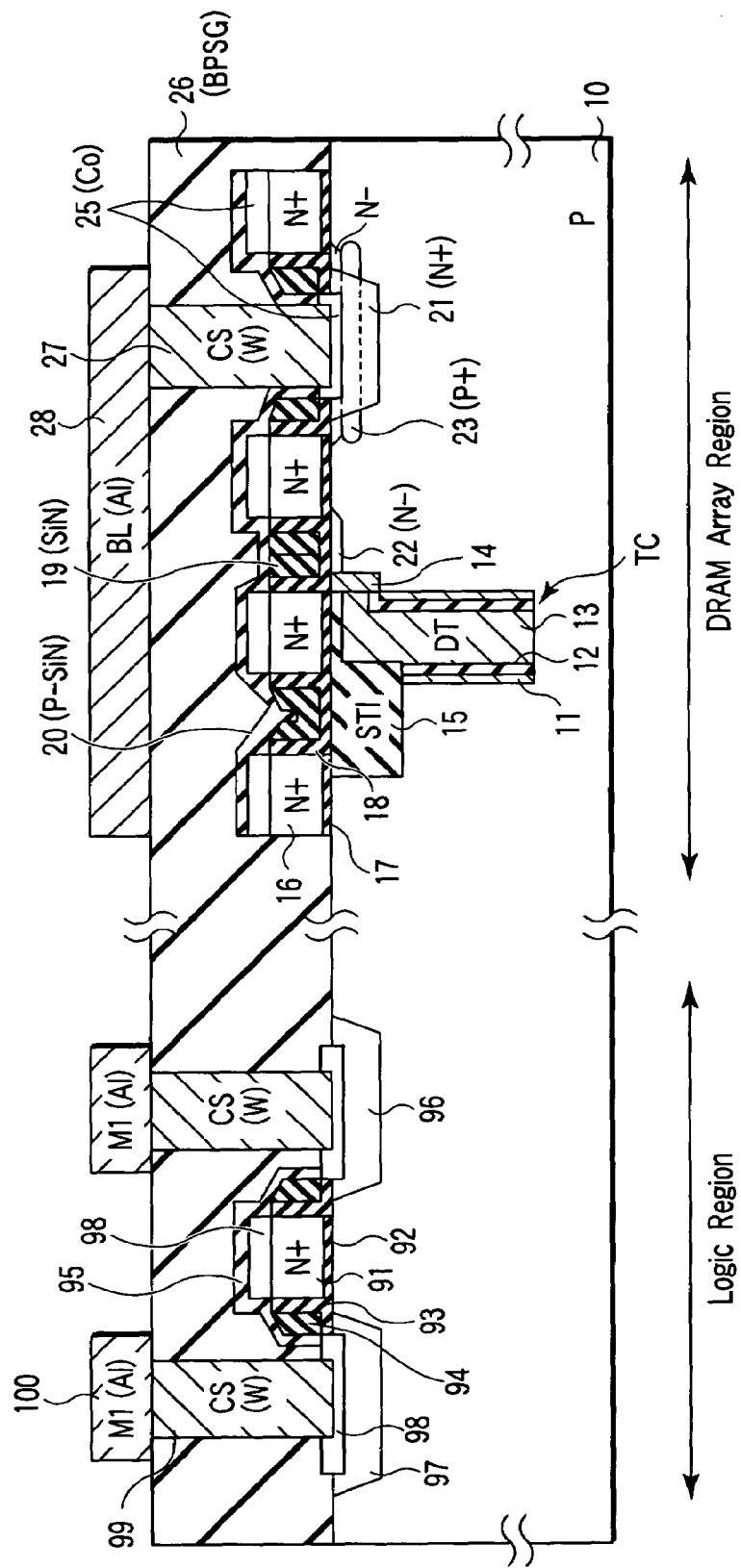
FIG. 1 is a sectional view showing a structure of a DRAM/logic-embedded device according to a first embodiment.

FIG. 1 is a sectional view schematically showing a DRAM/logic-embedded device according to the first embodiment.

FIG. 2 is a plan view schematically showing the layout of the trench cell region, the word line WL, and the bit line BL in one DRAM array region of FIG. 1. A sectional structure taken along the line I-I in FIG. 2 corresponds to the DRAM array region shown in FIG. 1.

In the DRAM array region, a plurality of buried strap type trench cells each including a charge accumulation trench capacitor TC, a buried strap region BS, and a transfer gate MOSFET are arranged in, e.g., a matrix of rows and columns, and they are isolated by an STI region as a unit of two trench cells adjacent to each other in the column direction.

A plurality of word lines WL which are commonly connected to the MOSFET gate electrodes of cells on the same rows of the cell array are formed. A plurality of bit lines BL which are commonly connected to MOSFET drain regions D of cells on the same columns of the cell array run perpendicularly to the word lines WL. Reference symbol S denotes a source region of the MOSFET; and BC, a bit line contact.

In the trench capacitor TC in FIG. 2, an impurity diffusion layer (capacitor plate) 11 is formed on an inner surface of a deep trench (DT) formed in a semiconductor substrate 10. A doped polysilicon charge storage region 13 is buried in the trench via an oxide film (capacitor insulating film) 12 on the surface of the impurity diffusion layer 11. In this case, part of the oxide film 12 is removed from the upper side surface of the trench in order to form a buried strap region (BS) 14 to be described later.

In an STI region 15 for isolation, an insulator is buried in a shallow trench selectively formed adjacent to the trench capacitor TC in the surface of the semiconductor substrate 10. The upper surface of the charge storage region 13 of the trench capacitor TC is covered successively with the insulator.

The buried strap region 14 is electrically connected to a MOSFET source region 22 to be described later by annealing in forming the STI region 15. The buried strap region 14 is formed by partially removing the upper portion of the oxide film 12 in the charge storage region 13 and diffusing an impurity into the removed portion in the semiconductor substrate 10.

Each MOSFET gate electrode (formed from doped polysilicon) 16 is formed on the surface of the semi-conductor substrate 10 via a gate insulating film 17. The gate electrodes 16 are connected to the word lines WL (see FIG. 2) which are, in turn, commonly connected to the MOSFETs of cells on the same rows of the cell array.

In FIG. 2, a word line connected to the MOSFET gate electrode of the cell in FIG. 1 is called a transfer word line Xfer-WL. A word line which passes over the trench capacitor TC and is connected to the MOSFET gate electrode of a cell (not shown) is called a pass word line Pass-WL.

A thin gate protection insulating film 18 is formed on the side surface of the gate electrode 16 in FIG. 1 by oxidization (post-oxidization) after formation of the gate electrode. A thick side wall insulating film 19 is formed from, e.g., a silicon nitride (SiN) film on the protection insulating film 18. A contact barrier film 20 is formed from a plasma silicon nitride (P-SiN) film so as to cover the surface of the side wall insulating film 19.

Reference numerals 21 and 22 denote a MOSFET drain region (D) and source region (S) formed from impurity diffusion layers selectively formed in the surface of the semiconductor substrate in self-alignment with the gate electrode 16 after formation of the gate protection insulating film. In this case, the drain region 21 is shared between two adjacent MOSFETS in the cell array. The source region 22 is connected to the buried strap region 14. The drain region 21 is formed into an LDD (Lightly Doped Drain) structure. A heavily doped impurity diffusion region ($N^+$ layer) having a deep junction and a conductivity type opposite to that of the substrate is formed at the center of the surface in the drain region 21 in self-alignment with the side wall insulating film 19. A metal (e.g., Co) silicide layer 25 is formed on the upper surface of both the impurity diffusion region and the gate electrode 16.

A pocket implantation region 23, which is comprised of an impurity with a high concentration (for example, boron B) of the same conductive type as that of the substrate, is formed under the drain region 21 of MOSFET. Here, the pocket implantation region 23 is not formed under the source region 22.

Thus, it becomes possible to suppress the short channel effect by forming the pocket implantation region 23 which is comprised of the impurity with the high concentration of the same conductive type as that of the semiconductor substrate 10 under one end of the channel side which causes the spread of a depletion layer to deteriorate the short channel.

In addition, since the pocket implantation region 23 is not provided under the source region 22, it is also possible to suppress an increase of the junction leak at a junction associated with the buried strap region 14 of the trench capacitor TC located in the vicinity of the source region 22.

An interlayer dielectric film 26 of a BPSG film is provided to cover the semiconductor substrate including the elements formed in the above-described way. A contact hole is formed in the interlayer dielectric film 26 at the center of the impurity diffusion layer in the drain region 21. A cell contact plug (CS) 27 of, e.g., tungsten (W) is buried in the contact hole. A bit line (BL) 28, which is composed of a metal film containing, e.g., Al as a main component, is provided on the interlayer dielectric film 26 in a direction intersecting with the word line WL so as to be connected to the cell contact plug 27.

In the logic region in FIG. 1, reference numeral 91 denotes a MOSFET gate electrode; 92, a gate insulating film; 93, a thin gate protection insulating film; 94, a thick side wall insulating film formed from, e.g., a silicon nitride (SiN) film; 95, a contact barrier film formed from a plasma silicon nitride (P-SiN) film; 96 and 97, a drain region and a source region of a MOSFET; 98, a metal silicide layer; 99, a cell contact plug (CS) formed from, e.g., tungsten (W); and 100, a metal wiring layer (M1) containing Al as a main component.

Figure 4:
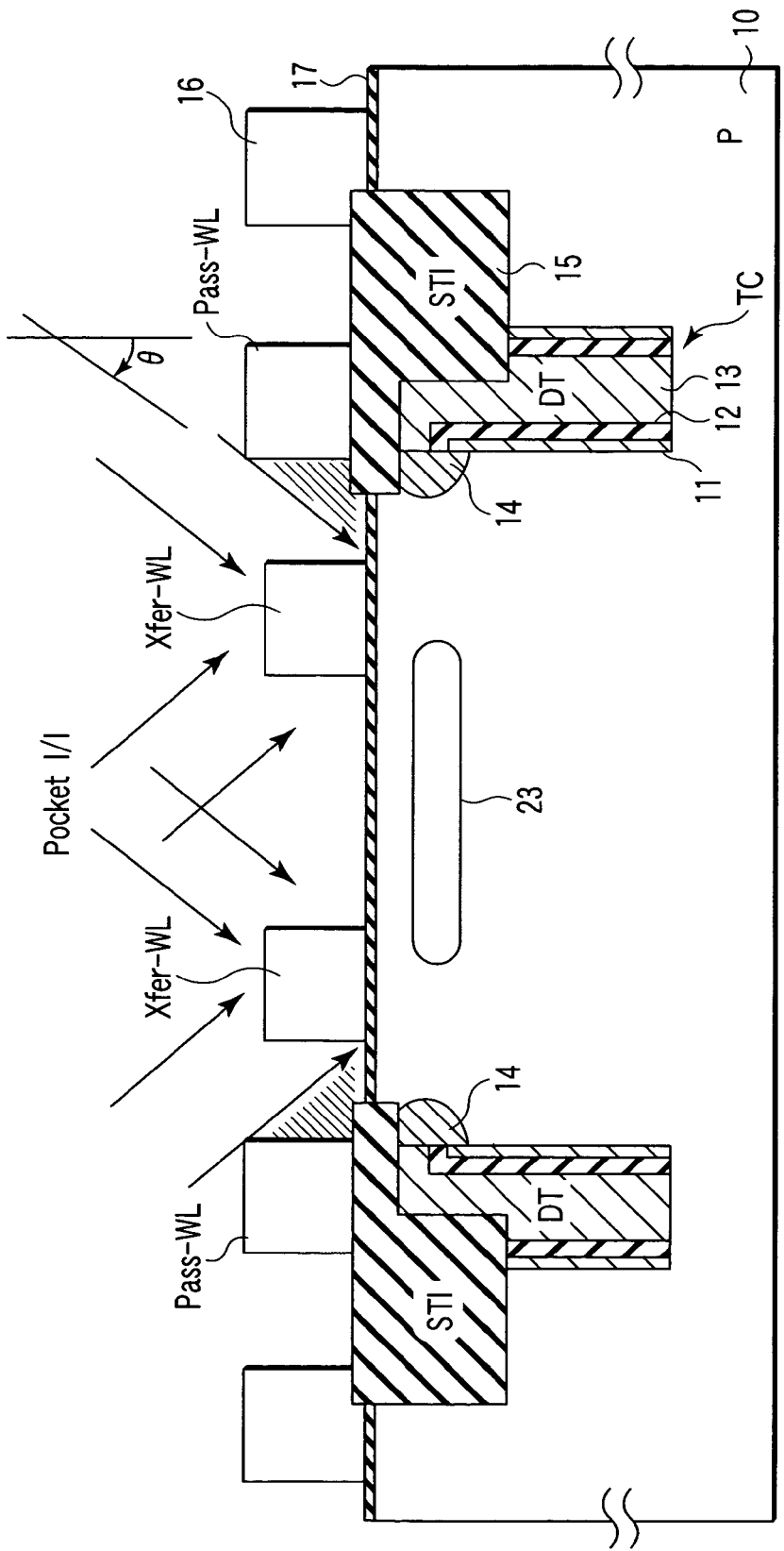
FIG. 4 is a sectional view schematically showing a step subsequent to FIG. 3.
Figure 5:
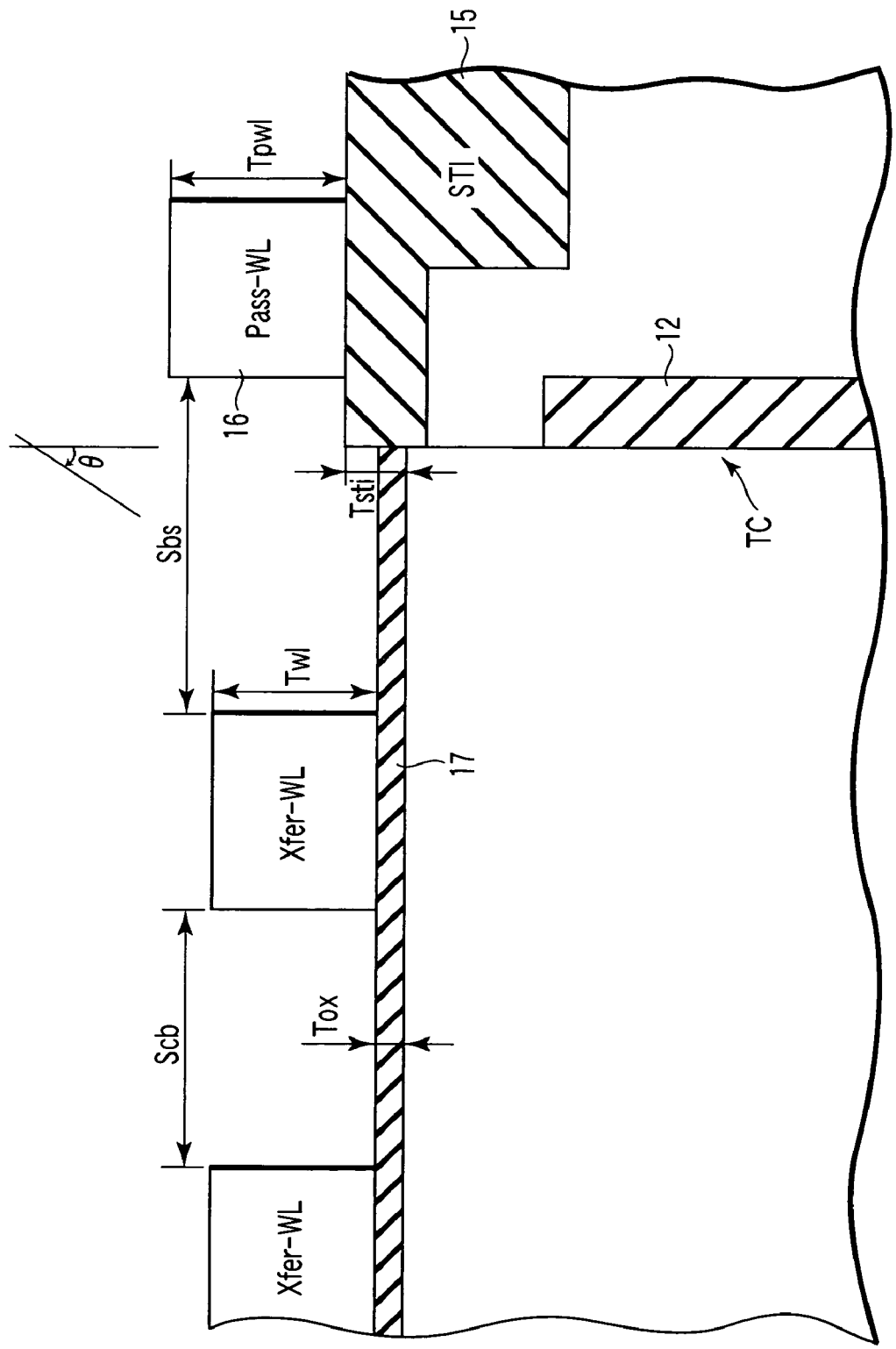
FIG. 5 is a sectional view schematically showing a step subsequent to FIG. 4.

FIGS. 3 to 5 schematically show sectional structures sequentially in steps of forming the DRAM array region shown in FIG. 1.

As shown in FIG. 3, the trench capacitor TC, the STI region 15, the buried strap region 14, and the gate insulating film 17 are formed on the p-type silicon substrate 10 in the same manner as the conventional one. A polysilicon layer is processed to form a polysilicon gate 16.

As shown in FIG. 4, a p-type impurity of the same conductivity type as that of the substrate 10, e.g., $BF_2$ ions is sequentially implanted from at least two directions on the two sides of the word line WL at an angle θ of 0° or more with respect to a direction perpendicular to the substrate 10 (oblique ion implantation is performed). At this time, the dose, acceleration energy, and implantation angle are properly set, and pocket implantation regions 23 are formed in regions only under the MOSFET drain region 21.

Oblique ion implantation (pocket I/I) of forming the pocket implantation regions 23 is executed. At this time, ions are implanted parallel to a direction extending from the upper edge of one side surface of the pass word line Pass-WL which passes over the trench region to the lower edge of one side surface of the transfer word line Xfer-WL. By the shadowing effect using the pass word line Pass-WL, the pocket implantation regions 23 are not formed under the source region 22.

The setting range of the implantation angle is increased as the interval between the pass word line pass-WL and the transfer word line Xfer-WL adjacent to each other is decreased, thereby facilitating the control.

That is, as shown in FIG. 5 which is a partially enlarged sectional view of FIG. 4, when an implantation angle of the pocket implantation is defined as θ; a space between the transfer word line Xfer-WL and the pass word Pass-WL is defined as Sbs; a space between the adjacent transfer word lines Xfer-WLs is defined as Scb; a height of the pass word line Pass-WL is defined as Tpwl; a height of an oxide film on an STI trench from the Si substrate is defined as Tsti; a height of the transfer word Xfer-WL is defined as Tw1; the thickness of a gate oxide film is defined as Tox; and a relationship between Scb and Sbs is Scb>Sbs, the ion implantation is carried out by selecting θ so as to be greater than an implantation angle θbs defined by tanθbs=Sbs/(Tsti+Tpwl) and is equal to or smaller than θcb defined by tanθcb=Scb/(Tw1+Tox). That is, the above relationship is defined as θbs<θ≦θcs.

Thus, the ion implantation angle θ is controlled to a proper angle, whereby the implanted ion does not enter the TC sidebecause it is shadowed by the pass word line Pass-WL. Therefore, the pocket implantation region 23 can be formed only under the drain region 21 without being formed in the source region 22. In this case, since the distance Scb between the transfer word lines Xfer-WLs is long, the pocket implantation region 23 is fully formed in a corresponding region under the drain region 21.

In addition, as the interval between the adjacent password line Pass-WL and transfer word line Xfer-WL becomes narrower, the setting range of the implantation angle θ becomes wider, thereby facilitating the control.

As described previously, on the TC side, there can be obtained a structure which does not allow degradation due to GIDL (Gate Induced Drain Leakage) leak caused by a junction on a surface as well as a junction leak of BS caused by the pocket implantation.

Thereafter, a drain region 21 and a source region 22 of the MOSFET are formed in the same manner as the conventional one, and the source region 22 is connected to the buried strap region 14. The wiring process is carried out to connect the bit line BL to the MOSFET drain region 21.

Now, a second embodiment will be described. Although the pocket implantation region 23 is formed only under the drain region 21 in the first embodiment, the pocket implantation region 23 is also formed under the source region 22 in this embodiment.

Figure 6:
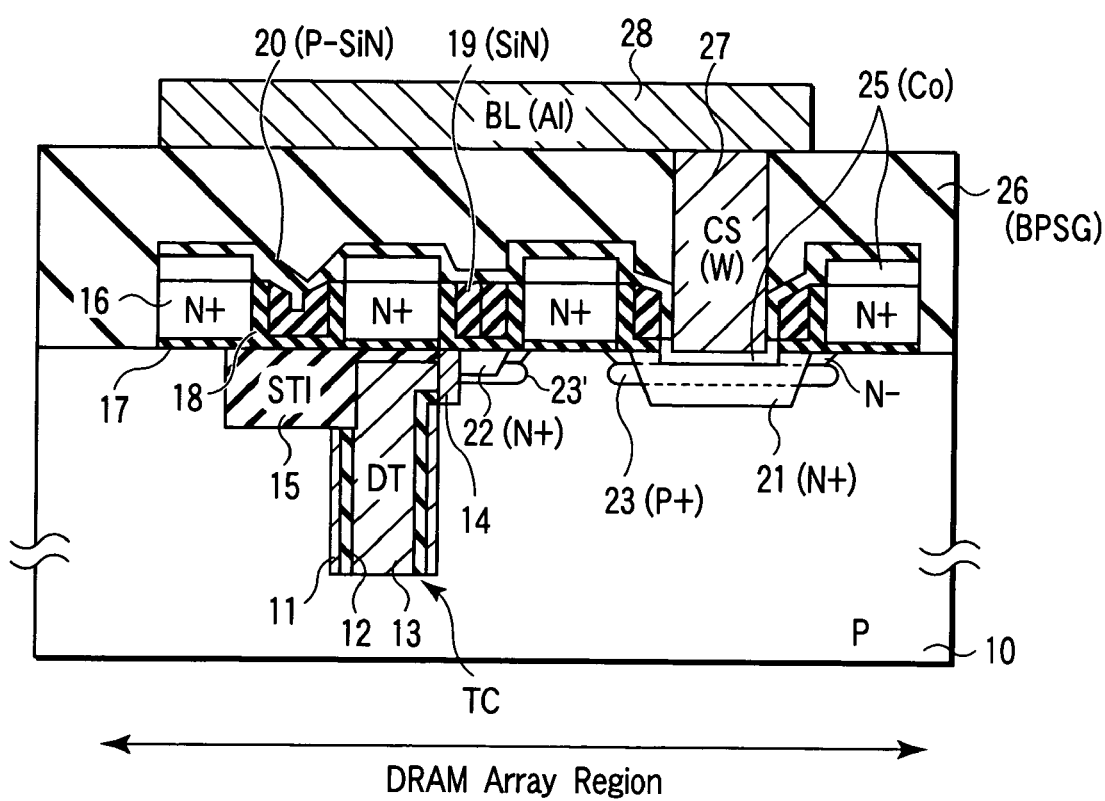
FIG. 6 is a sectional view showing a part of a structure of a DRAM/logic-embedded device according to a second embodiment.

That is, as shown in FIG. 6, a pocket implantation region 23' with an impurity concentration which is lower than that of the pocket implantation region 23 is formed in a region under the source region 22. The other structure is similar to that in the first embodiment, and thus like constituent elements are assigned by like reference numerals in FIG. 1. A duplicate description is omitted here.

The pocket implantation region 23' with a comparatively low impurity concentration is formed under the source region 22, thus making it possible to suppress an increase of the junction leak at the junction associated with the buried strap region 14 of the trench capacitor TC located in the vicinity of the pocket implantation region 23'.

In this case, the pocket implantation region 23' with the low impurity concentration formed under the source region 22 of MOSFET may be formed to be spaced from the buried strap region 14 of the trench capacitor. As the spacing distance becomes longer, the junction leak can be suppressed.

What is claimed is:

1. A semiconductor device comprising:
   a semiconductor substrate having a first conductivity type;
   a trench capacitor, provided in the semiconductor substrate, having a charge storage region;
   a gate electrode provided on the semiconductor substrate via a gate insulating film;
   a gate side wall insulating film provided on a side surface of the gate electrode;
   first and second impurity regions, provided at both ends of the gate electrode, respectively, having a second conductivity type;
   an isolation insulating film provided adjacent to the trench capacitor in the semiconductor substrate to cover an upper surface of the charge storage region;
   a buried strap region having the second conductivity type, the buried strap region being provided to electrically connect an upper portion of the charge storage region to the first impurity region in the semiconductor substrate; and
   a pocket implantation region having the first conductivity type, the pocket implantation region being provided only under the second impurity region and being spaced apart from the strap region.

2. The device according to claim 1, wherein the pocket implantation region under the second impurity region is provided under one end of the channel side of the second impurity region.

3. The device according to claim 1, wherein the pocket implantation region is higher in impurity concentration than the semiconductor substrate.

4. The device according to claim 1, wherein the semiconductor device is a DRAM device.

* * * * *